United States Patent
Kim et al.

(10) Patent No.: US 10,269,876 B2
(45) Date of Patent: *Apr. 23, 2019

(54) ORGANIC LIGHT EMITTING DIODE DISPLAY

(71) Applicant: Samsung Display Co., Ltd., Yongin-si (KR)

(72) Inventors: Suk Kim, Hwaseong-si (KR); Sun Young Oh, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/893,687

(22) Filed: Feb. 11, 2018

(65) Prior Publication Data

US 2018/0166506 A1    Jun. 14, 2018

Related U.S. Application Data

(63) Continuation of application No. 15/332,763, filed on Oct. 24, 2016, now Pat. No. 9,917,143.

(30) Foreign Application Priority Data

Feb. 12, 2016    (KR) .................. 10-2016-0016635

(51) Int. Cl.
  *H01L 27/32*    (2006.01)
  *H01L 51/52*    (2006.01)

(52) U.S. Cl.
  CPC ........ *H01L 27/322* (2013.01); *H01L 27/3211* (2013.01); *H01L 27/3213* (2013.01); *H01L 51/5203* (2013.01); *H01L 51/5265* (2013.01)

(58) Field of Classification Search
  CPC . H01L 51/5265; H01L 27/3211; H01L 27/322
  See application file for complete search history.

(56) References Cited

U.S. PATENT DOCUMENTS

| | | |
|---|---|---|
| 2007/0102737 A1 | 5/2007 | Kashiwabara et al. |
| 2008/0218070 A1 | 9/2008 | Kobayashi |

(Continued)

FOREIGN PATENT DOCUMENTS

| | | |
|---|---|---|
| EP | 1672962 | 6/2006 |
| JP | 4579552 | 8/2005 |

(Continued)

OTHER PUBLICATIONS

Milone et al., "Pulsed Led's Light at 650 nm Promote and at 470 nm Suppress Melatonin's Secretion", Neuroscience & Medicine, 2015, pp. 35-41, vol. 6, Scientific Research Publishing.

(Continued)

*Primary Examiner* — Lex H Malsawma
*Assistant Examiner* — Xia L Cross
(74) *Attorney, Agent, or Firm* — H.C. Park & Associates, PLC

(57) ABSTRACT

An organic light emitting diode display includes a substrate and a first red organic light emitting element disposed on the substrate. The first red organic light emitting element may include a first light emission region and a second light emission region, wherein the first light emission region emits a first red light having a first peak wavelength, and the second light emission region emits a second red light having a second peak wavelength different from the first peak wavelength.

17 Claims, 9 Drawing Sheets

(56) References Cited

U.S. PATENT DOCUMENTS

| | | | |
|---|---|---|---|
| 2008/0225283 A1* | 9/2008 | Chi | G01N 21/8806 356/237.5 |
| 2011/0062475 A1* | 3/2011 | Cho | H01L 51/5036 257/98 |
| 2011/0180825 A1 | 7/2011 | Lee et al. | |
| 2011/0199753 A1 | 8/2011 | Ramer et al. | |
| 2011/0210323 A1 | 9/2011 | Imai | |
| 2014/0070171 A1 | 3/2014 | Liu et al. | |
| 2014/0240975 A1* | 8/2014 | Lee | H01L 25/167 362/231 |
| 2015/0034911 A1 | 2/2015 | Liu et al. | |
| 2015/0155519 A1 | 6/2015 | Lee | |
| 2018/0040665 A1* | 2/2018 | Ohmae | H01L 33/46 |

FOREIGN PATENT DOCUMENTS

| | | |
|---|---|---|
| JP | 2014-209362 | 11/2014 |
| KR | 10-2011-0067139 | 6/2011 |

OTHER PUBLICATIONS

Johnstone et al., "Targeting the body to protect the brain: inducing neuroprotection with remotely-applied near infrared light", Neural Regeneration Research, Mar. 2015, pp, 349-351, vol. 10(3).

Johnstone et al., "Indirect application of near infrared light induces neuroprotection in a mouse model of Parkinsonism—an abscopal neuroprotective effect", Neuroscience, 2014, pp. 93-101, vol. 274, Elsevier Ltd.

Notice of Allowance dated Nov. 2, 2017, issued in U.S. Appl. No. 15/332,763.

Non-Final Office Action dated Jul. 28, 2017, issued in U.S. Appl. No. 15/332,763.

* cited by examiner

ORGANIC LIGHT EMITTING DIODE DISPLAY

CROSS-REFERENCE TO RELATED APPLICATIONS

This application is a Continuation of U.S. patent application Ser. No. 15/332,763, filed on Oct. 24, 2016, and claims priority from and the benefit of Korean Patent Application No. 10-2016-0016635, filed on Feb. 12, 2016, which is hereby incorporated by reference for all purposes as if fully set forth herein.

BACKGROUND

Field

Exemplary embodiments relate to an organic light emitting diode display.

Discussion of the Background

A display device is a device that displays an image. Recently, organic light emitting diode displays have been drawing attention.

In general, an organic light emitting diode display includes an organic light emitting element emitting light having different wavelengths for every pixel as a minimum unit displaying an image. The organic light emitting element includes a first electrode, an organic emission layer emitting light, and a common electrode that are sequentially deposited.

The above information disclosed in this Background section is only for enhancement of understanding of the background of the described technology and therefore it may contain information that does not form the prior art that is already known in this country to a person of ordinary skill in the art.

SUMMARY

Exemplary embodiments provide an organic light emitting diode display for increasing the melatonin secretion of a user.

Additional aspects will be set forth in the detailed description which follows, and, in part, will be apparent from the disclosure, or may be learned by practice of the inventive concept.

An exemplary embodiment discloses an organic light emitting diode display that includes a substrate and a first red organic light emitting element disposed on the substrate. The first red organic light emitting element may include a first light emission region and a second light emission region, wherein the first light emission region emits a first red light having a first peak wavelength, and the second light emission region emits a second red light having a second peak wavelength different from the first peak wavelength.

An exemplary embodiment also discloses an organic light emitting diode display that includes a substrate, a third red organic light emitting element positioned on the substrate and emitting a third red light, and a fourth red organic light emitting element adjacent to the third red organic light emitting element on the substrate and emitting a fourth red light. The third red light may have a third peak wavelength, and the fourth red light may have a fourth peak wavelength different from the third peak wavelength.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
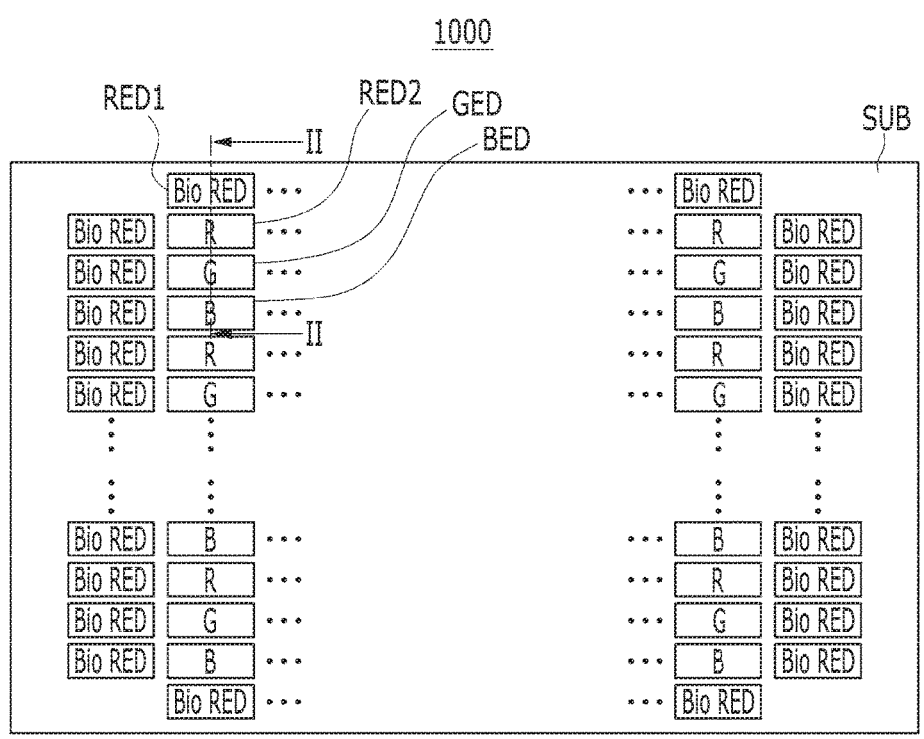
FIG. 1 is a top plan view of an organic light emitting diode display according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Now, an organic light emitting diode display according to an exemplary embodiment will be described with reference to FIG. 1, FIG. 2, and FIG. 3A.

FIG. 1 is a top plan view of an organic light emitting diode display according to an exemplary embodiment, showing organic light emitting elements disposed on a substrate.

As shown in FIG. 1, an organic light emitting diode display 1000 according to an exemplary embodiment includes a substrate SUB, a first red organic light emitting element RED1, a second red organic light emitting element RED2, a green organic light emitting element GED, and a blue organic light emitting element BED. One pixel, as a minimum unit displaying an image, may include at least one among the first red organic light emitting element RED1, the second red organic light emitting element RED2, the green organic light emitting element GED, and the blue organic light emitting element BED.

The substrate SUB may be an insulating substrate including an organic material, an inorganic material, a metal, etc. The substrate SUB may be flexible, however, it is not limited thereto.

The first red organic light emitting element RED1 emits a first red light having a first peak wavelength and a second red light that has a different wavelength from the first peak wavelength and has a larger second peak wavelength than the first wavelength. Here, the first peak wavelength of the first red light has a range of 580 nm to 620 nm, and the second peak wavelength of the second red light has a range of 620 nm to 680 nm, however, it is not limited thereto.

The first red organic light emitting element RED1 is disposed adjacent to the frame of the substrate SUB.

A plurality of first red organic light emitting elements RED1 may be disposed along the frame of the substrate SUB.

The second red organic light emitting element RED2 may be adjacent to the first red organic light emitting element RED1. The second red organic light emitting element RED2 emits the first red light having the first peak wavelength. The second red organic light emitting element RED2 may be emitted concurrent with the first red organic light emitting element RED1, however, it is not limited thereto.

The green organic light emitting element GED may be adjacent to the second red organic light emitting element RED2. The green organic light emitting element GED emits green light.

The blue organic light emitting element BED may be adjacent to the green organic light emitting element GED. The blue organic light emitting element BED emits blue light.

Figure 2:
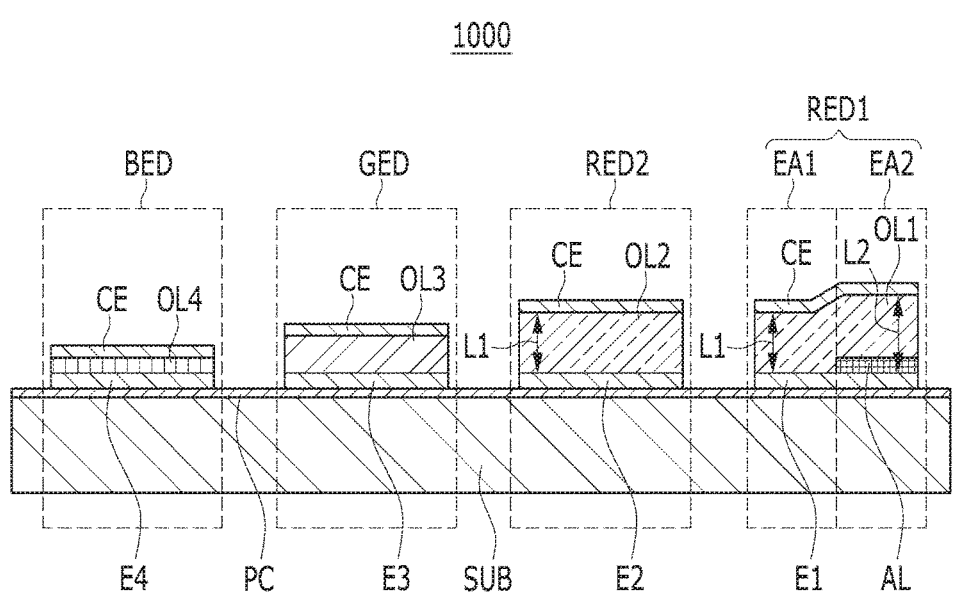
FIG. 2 is a cross-sectional view taken along a line II-II of FIG. 1.

FIG. 2 is a cross-sectional view taken along a line II-II of FIG. 1. In FIG. 2, each light emission region of the first red organic light emitting element RED1, the second red organic light emitting element RED2, the green organic light emitting element GED, and the blue organic light emitting element BED may be defined by an opening of a pixel definition layer not shown for convenience of explanation, however it is not limited thereto.

As shown in FIG. 2, the organic light emitting diode display 1000 may further includes a pixel circuit PC positioned on the substrate SUB.

The pixel circuit PC may be positioned on the substrate SUB and may be respectively connected with the first red organic light emitting element RED1, the second red organic light emitting element RED2, the green organic light emitting element GED, and the blue organic light emitting element BED. The pixel circuit PC may include wiring including at least one of a scan line, a data line, a driving power source line, a common power source line, etc., and a plurality of thin film transistors TFT, and at least one capacitor corresponding to one organic light emitting element connected with the wiring.

The first red organic light emitting element RED1 may include a first electrode E1, a first organic emission layer OL1, a common electrode CE, an auxiliary layer AL, a first light emission region EA1, and a second light emission region EA2.

The first electrode E1 may be connected with the pixel circuit PC and may be an anode that is a hole injection electrode, however it is not limited thereto, and the first electrode E1 may be a cathode that is an electron injection electrode. The first electrode E1 is a light reflective electrode. The first electrode E1 may have smaller light transmittance compared with the second electrode E2 and the auxiliary layer AL. The first electrode E1 may include a light transmission conductive layer of a single layer or a multilayer, and include at least one of indium tin oxide (ITO) and indium zinc oxide (IZO), or a light reflective conductive layer including a metal having light reflectance such as Ag. The first electrode E1 reflects the light emitted from the first organic emission layer OL1 in a direction of the common electrode CE.

The first organic emission layer OL1 is disposed on the first electrode E1. The first organic emission layer OL1 includes at least a main emission layer among the hole injection layer, a hole transport layer, and an auxiliary organic layer, the main emission layer emitting light, and the electron transport layer and the electron injection layer. The first organic emission layer OL1 may include a red emission material. The first organic emission layer OL1 may have a predetermined thickness, therefore a first distance L1 may be formed between the first electrode E1 corresponding to the first light emission region EA1 and the common electrode CE, and a second distance L2 may be formed between the first electrode E1 of the second light emission region EA2 and the common electrode CE. Here, the second distance L2 may be longer than the first distance L1. The first distance L1 may be an optimized distance for generating constructive interference by corresponding to the first red light having the first peak wavelength of the range of 580 nm to 620 nm. The second distance L2 may be an optimized distance for generating the constructive interference by corresponding to the second red light having the second peak wavelength of the range of 620 nm to 680 nm.

The common electrode CE is disposed on the first organic emission layer OL1. The common electrode CE may be a cathode that is the electron injection electrode, however it is not limited thereto, and it may be the anode that is the hole injection electrode. The common electrode CE is a transparent electrode. The common electrode CE may have a shape extending entirely over the first red organic light emitting element RED1, the second red organic light emitting element RED2, the green organic light emitting element GED, and the blue organic light emitting element BED. The common electrode CE may include light transmissive conductive material or transparent conductive material of a single layer or be multilayer, including at least one among indium tin oxide (ITO), indium zinc oxide, (IZO), aluminum (Al), silver (Ag), lithium (Li), magnesium (Mg), etc.

The auxiliary layer AL corresponds to the second light emission region EA2, and is disposed between the first electrode E1 and the first organic emission layer OL1. The auxiliary layer AL does not overlap the first light emission region EA1. As the auxiliary layer AL is positioned between the first electrode E1 and the first organic emission layer OL1 by corresponding to the second light emission region EA2, the above-described first distance L1 is formed between the first electrode E1 corresponding to the first light emission region EA1 and the common electrode CE, and the above-described second distance L2 that is longer than the first distance L1 is formed between the first electrode E1 corresponding to the second light emission region EA2 and the common electrode CE. The auxiliary layer AL may be the light transmissive layer. The auxiliary layer AL may include the light transmissive conductive material of the single layer or the multilayer including at least one among indium tin oxide (ITO), amorphous indium tin oxide (a-ITO), and indium zinc oxide (IZO). Also, the auxiliary layer AL may include the light transmissive material of the single layer or the multilayer including the same material as at least one among the hole injection layer, the hole transport layer, and the auxiliary organic layer included in the first organic emission layer OL1. The auxiliary layer AL may have the thickness of 150 Å to 250 Å, however it is not limited thereto.

The first light emission region EA1 is the region that does not overlap the auxiliary layer AL. The first light emission region EA1 emits the first red light having the first peak wavelength having the range of 580 nm to 620 nm. The first light emission region EA1 may have a wider area than the second light emission region EA2.

On the other hand, the first light emission region EA1 may have a narrower area than the second light emission region EA2, or may have the same area as the second light emission region EA2.

The second light emission region EA2 may be adjacent to the first light emission region EA1 and may be the region overlapping the auxiliary layer AL. The second light emission region EA2 emits the second red light having the second peak wavelength having the range of 620 nm to 680 nm. For example, the second peak wavelength may be 650 nm.

The first light emission region EA1 and the second light emission region EA2 included in the first red organic light emitting element RED1 may emit simultaneously.

Figure 3A:
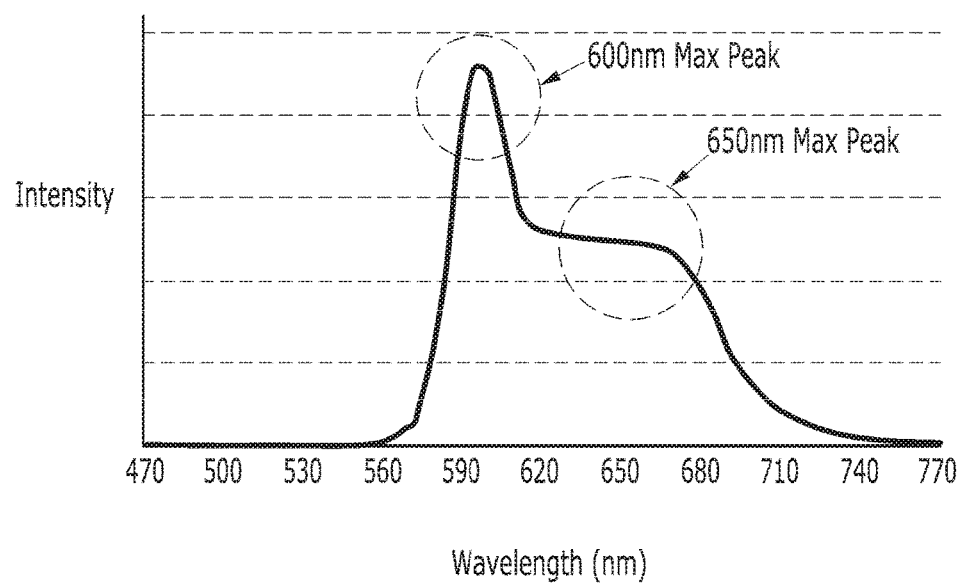
FIG. 3A is a graph showing a strength depending on a wavelength of light emitted by a first red organic light emitting element shown in FIG. 1.

FIG. 3A is a graph showing a strength depending on a wavelength of light emitted by the first red organic light emitting element shown in FIG. 1. In FIG. 3A, the horizontal axis represents the wavelength of the light, and the vertical axis represents the strength of the light.

As shown in FIG. 3A, the light emitted by the first red organic light emitting element RED1 includes the first red light having the first peak wavelength of the range of 580 nm to 620 nm and the second red light having the second peak wavelength of the range of 620 nm to 680 nm. For example, the first red light emitted from the first light emission region EA1 may have the peak wavelength of 600 nm, and the second red light emitted from the second light emission region EA2 may have the peak wavelength of 650 nm, however the peak wavelength of the first red light and the peak wavelength of the second red light are not limited thereto.

As described above, the first red organic light emitting element RED1 may emit the first red light having the first peak wavelength in the first light emission region EA1, and may simultaneously emit the second red light having the second peak wavelength of the range of 620 nm to 680 nm in the second light emission region EA2.

By emitting the second red light having the second peak wavelength of the range of 620 nm to 680 nm and having the peak wavelength in the wavelength of 650 nm in the second light emission region EA2 of the first red organic light emitting element RED1, melatonin secretion of the user may be increased.

In a human eye, there are melatonin control cells which are believed to control melatonin secretion, in addition to rod cells and cone cells. Melatonin is a hormone which is involved in regulating a human's biological rhythm by detecting a light period. Melatonin control cells may increase melatonin secretion when absorbing light of a 650 nm wavelength in the light of the sun. Melatonin is believed to be involved in regulating blood flow, hormone control, and waste removal, as well as having a simple sleep inducing effect. As such, melatonin is a hormone with a very important role.

By emitting the second red light having the second peak wavelength of the range of 620 nm to 680 nm having 650 nm in the second light emission region EA2 of the first red organic light emitting element RED1, because the melatonin secretion of the user may be increased, along with the sleep inducing effect of the user, the regulating of blood flow, hormonal control, and waste removal may be improved such that the biorhythm of the user is improved.

By emitting the second red light in the second light emission region EA2 of the first red organic light emitting element RED1 and simultaneously emitting the first red light having the first peak wavelength with the range of 580 nm to 620 nm in the first light emission region EA1, the shifting of the red light emitted in the entire organic light emitting diode display 1000 due to the second red light may be minimized by a simultaneous emission of the first red light.

Again referring to FIG. 2, the second red organic light emitting element RED2 may emit the first red light that is substantially the same as the first red light having the first peak wavelength emitted in the first light emission region EA1 of the first red organic light emitting element RED1. The second red organic light emitting element RED2 may include the second electrode E2, the second organic emission layer OL2, and the common electrode CE.

The second electrode E2 is separated from the first electrode E1 and is connected with the pixel circuit PC, and may be the anode that is the hole injection electrode, however it is not limited thereto, and it may be the cathode that is the electron injection electrode. The second electrode E2 may include the same material as the first electrode E1 of the first red organic light emitting element RED1.

The second organic emission layer OL2 is disposed on the second electrode E2. The second organic emission layer OL2 includes at least a main emission layer among the hole injection layer, the hole transport layer, and the auxiliary organic layer, the main emission layer emitting light, and the electron transport layer and the electron injection layer. The second organic emission layer OL2 may include the same red emission material as the first organic emission layer OL1. The second organic emission layer OL2 may have the same thickness as the first organic emission layer OL1, thereby forming the first distance L1 between the second electrode E2 of the second red organic light emitting element RED2 and the common electrode CE.

The common electrode CE is disposed on the second organic emission layer OL2. The common electrode CE may be the cathode that is the electron injection electrode, however it may be the anode that is the hole injection electrode.

The green organic light emitting element GED emits green light. The green organic light emitting element GED may include the third electrode E3, the third organic emission layer OL3, and the common electrode CE.

The third electrode E3 is separated from the second electrode E2 and is connected with the pixel circuit PC, and may be the anode that is the hole injection electrode, however it may be the cathode that is the electron injection electrode. The third electrode E3 may include the same material as the first electrode E1 and the second electrode E2.

The third organic emission layer OL3 is disposed on the third electrode E3. The third organic emission layer OL3 includes at least a main emission layer among the hole injection layer, the hole transport layer, and the auxiliary organic layer, the main emission layer emitting the light, and the electron transport layer and the electron injection layer. The third organic emission layer OL3 includes a green emission material. The third organic emission layer OL3 may have a thinner thickness than the second organic emission layer OL2.

The common electrode CE is disposed on the third organic emission layer OL3.

The blue organic light emitting element BED emits blue light. The blue organic light emitting element BED includes the fourth electrode E4, the fourth organic emission layer OL4, and the common electrode CE.

The fourth electrode E4 is separated from the third electrode E3 and is connected with the pixel circuit PC, and may be the anode that is the hole injection electrode, however it is not limited thereto and it may be the cathode that is the electron injection electrode. The fourth electrode E4 may include the same material as the first electrode E1, the second electrode E2, and the third electrode E3.

The fourth organic emission layer OL4 is disposed on the fourth electrode E4. The fourth organic emission layer OL4 includes at least a main emission layer among the hole injection layer, the hole transport layer, and the auxiliary organic layer, the main emission layer emitting the light, and the electron transport layer and the electron injection layer. The fourth organic emission layer OL4 includes blue emission material. The fourth organic emission layer OL4 may have a thinner thickness than the third organic emission layer OL3.

The common electrode CE is disposed on the fourth organic emission layer OL4.

As described above, in the organic light emitting diode display 1000 according to an exemplary embodiment, the first red organic light emitting element RED1 emits the first red light having the first peak wavelength in the first light emission region EA1 and simultaneously emits the second red light having the second peak wavelength of the range of 620 nm to 680 nm in the second light emission region EA2. By emitting the second red light having the second peak wavelength having the range of 620 nm to 680 nm including the 650 nm wavelength in the second light emission region EA2 of the first red organic light emitting element RED1, the melatonin secretion of the user may be increased.

As the organic light emitting diode display 1000 according to an exemplary embodiment emits the second red light having the second peak wavelength of the range of 620 nm to 680 nm including 650 nm in the second light emission region EA2 of the first red organic light emitting element RED1, the melatonin secretion of the user may be increased, thereby improving the user's biorhythm.

The organic light emitting diode display 1000 according to an exemplary embodiment emits the second red light in the second light emission region EA2 of the first red organic light emitting element RED1, and simultaneously emits the first red light having the first peak wavelength of the range of 580 nm to 620 nm in the first light emission region EA1. Accordingly, the organic light emitting diode display 1000 in which the shifting of the red light emitted in the entire organic light emitting diode display 1000 by the second red light may be minimized by the simultaneous emission of the first red light may be provided.

In the organic light emitting diode display 1000 according to an exemplary embodiment, since the first red organic light emitting element RED1 is disposed along the border of the substrate SUB, the change of the red light emitted in the entire organic light emitting diode display 1000 due to the second red light emitted in the second light emission region EA2 of the first red organic light emitting element RED1 may be minimized.

Next, a simulation confirming that the wavelength of the light emitted from the red organic light emitting element is changed by the auxiliary layer will be described with reference to FIG. 3B.

Figure 3B:
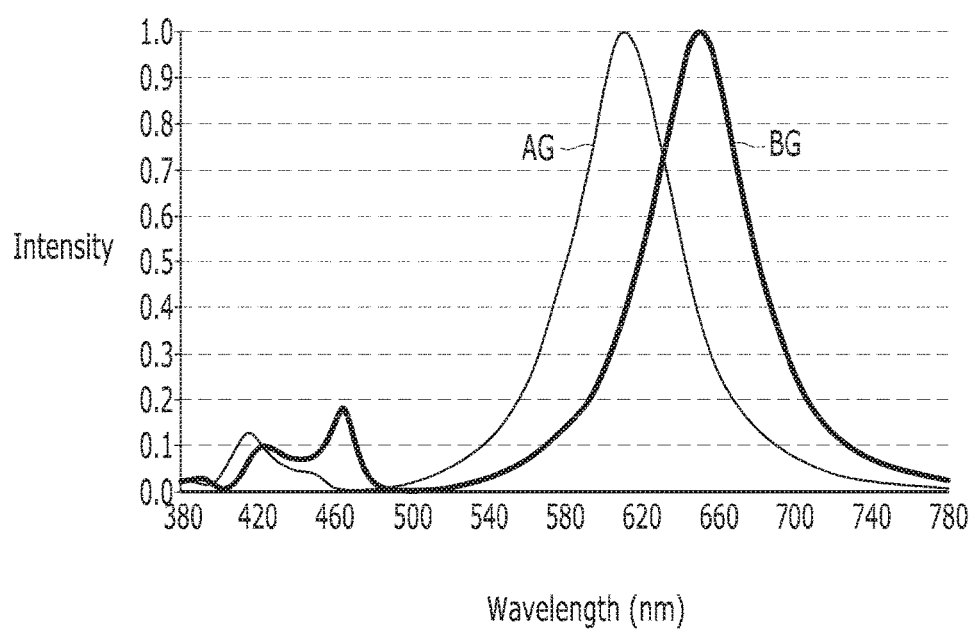
FIG. 3B is a graph showing a strength depending on a wavelength of light emitted by a red organic light emitting element and a strength depending on a wavelength of light emitted by a red organic light emitting element including an auxiliary layer.

FIG. 3B is a graph showing a strength depending on a wavelength of light emitted by a red organic light emitting element and a strength depending on a wavelength of light emitted by a red organic light emitting element including an auxiliary layer. In FIG. 3B, AG is a curve representing the wavelength of the light emitted by the red organic light emitting element, and BG is a curve representing the wavelength of the light emitted by the red organic light emitting element included in the auxiliary layer. In FIG. 3B, the horizontal axis represents the wavelength of the light, and the vertical axis represented the strength of the light.

As shown in FIG. 3B, the wavelength of the light emitted by the red organic light emitting element is the AG curve having the peak wavelength at 611 nm. Here, in the red organic light emitting element, the distance from the anode to the cathode may be 2,855 Å, however, it is not limited thereto.

The red organic light emitting element may include the auxiliary layer having the thickness of 200 Å. Accordingly, the wavelength of the light by the red organic light emitting element including the auxiliary layer is the BG curve having the peak wavelength at 650 nm.

Next, the organic light emitting diode display according to another exemplary embodiment will be described with reference to FIG. 4 and FIG. 5. Hereafter, different parts from the above-described organic light emitting diode display according to an exemplary embodiment will be described.

Figure 4:
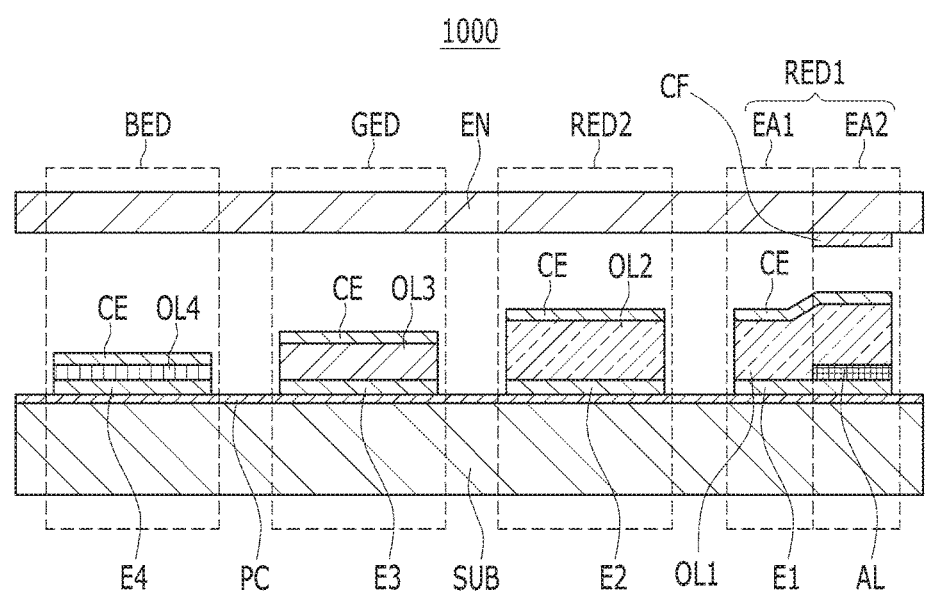
FIG. 4 is a cross-sectional view of an organic light emitting diode display according to another exemplary embodiment.

FIG. 4 is a cross-sectional view of an organic light emitting diode display according to another exemplary embodiment.

As shown in FIG. 4, the organic light emitting diode display 1000 according to an exemplary embodiment further includes an encapsulation part EN and a red color filter CF positioned on the first red organic light emitting element RED1, the second red organic light emitting element RED2, the green organic light emitting element GED, and the blue organic light emitting element BED.

The encapsulation part EN may have a substrate shape or a thin film sealing layer shape, and may seal the first red organic light emitting element RED1, the second red organic light emitting element RED2, the green organic light emitting element GED, and the blue organic light emitting element BED along with the substrate SUB.

The red color filter CF may be positioned on the first red organic light emitting element RED1 corresponding to the second light emission region EA2 of the first red organic light emitting element RED1.

Figure 5:
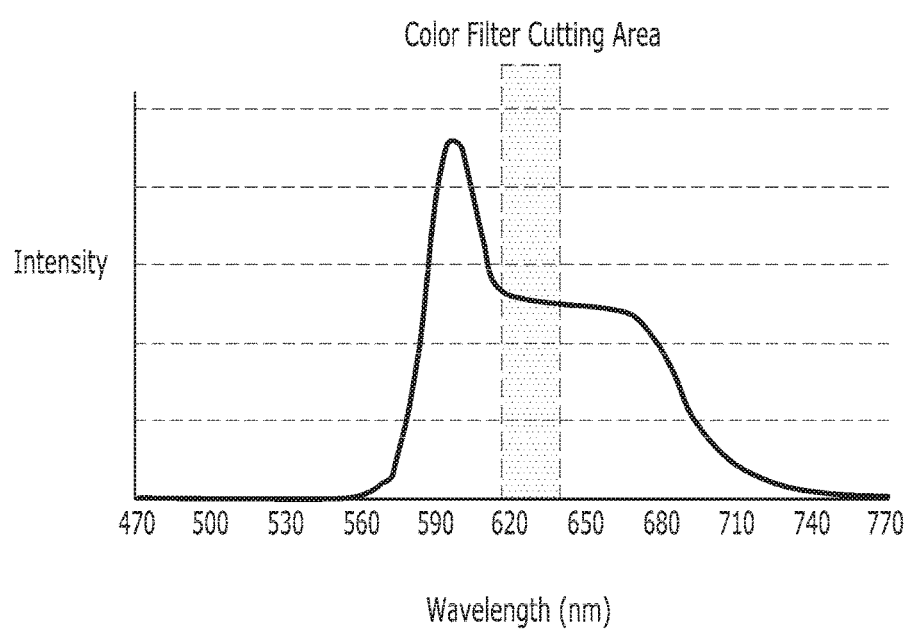
FIG. 5 is a graph of a wavelength range of a light blocked by a red color filter shown in FIG. 4.

FIG. 5 is a graph of a wavelength range of a light blocked by a red color filter shown in FIG. 4. In FIG. 5, the horizontal axis represents the wavelength of the light, and the vertical axis represents the strength of the light.

Like a color filter cutting region shown in FIG. 5, the red color filter CF may block the light having the wavelength of 620 nm to 640 nm among the wavelength range of the second red light emitted from the second light emission region EA2.

As the organic light emitting diode display 1000 according to an exemplary embodiment emits the second red light having the wavelength of the range of 620 nm to 680 nm in the second light emission region EA2 of the first red organic light emitting element RED1, and the red color filter CF blocks the light having the wavelength of 620 nm to 640 nm among the second red light, the red light having the peak wavelength of the range of 641 nm to 680 nm may be irradiated to the user.

As the organic light emitting diode display 1000 according to an exemplary embodiment emits the red light having the peak wavelength of 641 nm to 680 nm including 650 nm, the melatonin secretion of the user may be increased, thereby improving the user's biorhythm.

Next, the organic light emitting diode display according to another exemplary embodiment will be described with reference to FIG. 6. Hereinafter, different parts from the above-described organic light emitting diode display according to an exemplary embodiment will be described.

Figure 6:
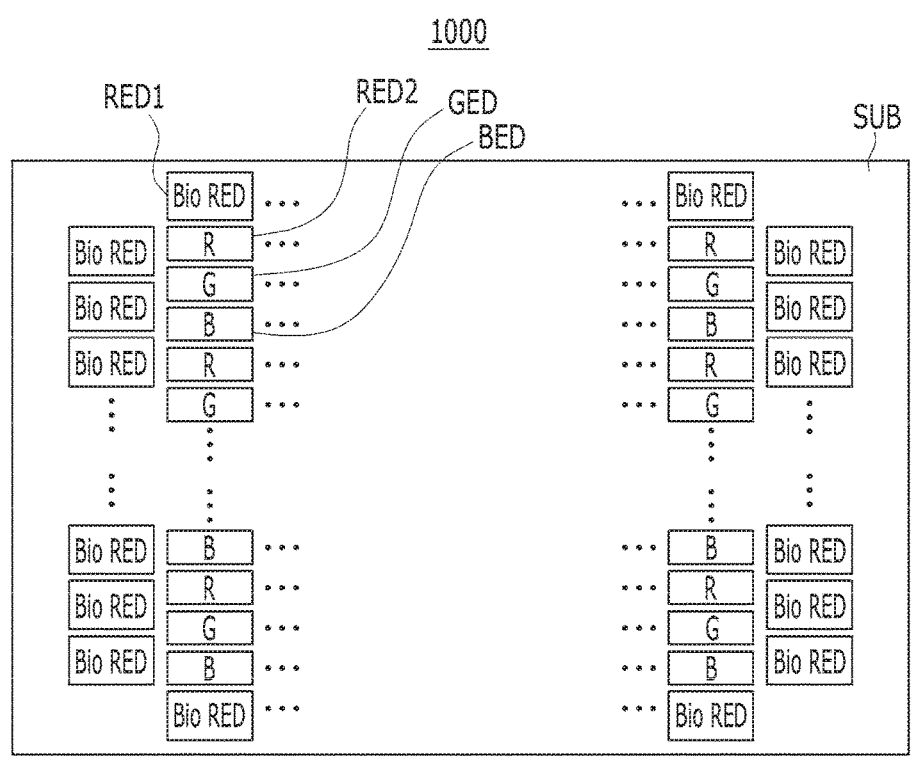
FIG. 6 is a top plan view showing an organic light emitting diode display according to another exemplary embodiment.

FIG. 6 is a top plan view showing an organic light emitting diode display according to another exemplary embodiment.

As shown in FIG. 6, the organic light emitting diode display 1000 according to an exemplary embodiment includes a substrate SUB, a first red organic light emitting element RED1, a second red organic light emitting element RED2, a green organic light emitting element GED, and a blue organic light emitting element BED.

The first red organic light emitting element RED1 emits the first red light having the first peak wavelength and the second red light with a different wavelength from the first peak wavelength and having the larger second peak wavelength than first peak wavelength. Here, the first peak wavelength of the first red light has the range of 580 nm to 620 nm, and the second peak wavelength of the second red light has the range of 620 nm to 680 nm, however, they are not limited thereto.

The first red organic light emitting element RED1 may have a larger emission area than the second red organic light emitting element RED2. Each emission area of the first red organic light emitting element RED1 and the second red organic light emitting element RED2 may be defined by the opening of the pixel definition layer that is not shown for convenience of description, however, it is not limited thereto.

As described above, in the organic light emitting diode display 1000 according to an exemplary embodiment, as the first red organic light emitting element RED1 has the larger emission area than the second red organic light emitting element RED2, in the first red organic light emitting element RED1, the second red light having the second peak wavelength of the range of 620 nm to 680 nm is further emitted, thereby increasing the melatonin secretion of the user.

Next, the organic light emitting diode display according to an exemplary embodiment will be described with reference to FIG. 7 and FIG. 8. Hereinafter, different parts from the above-described organic light emitting diode display according to an exemplary embodiment will be described.

Figure 7:
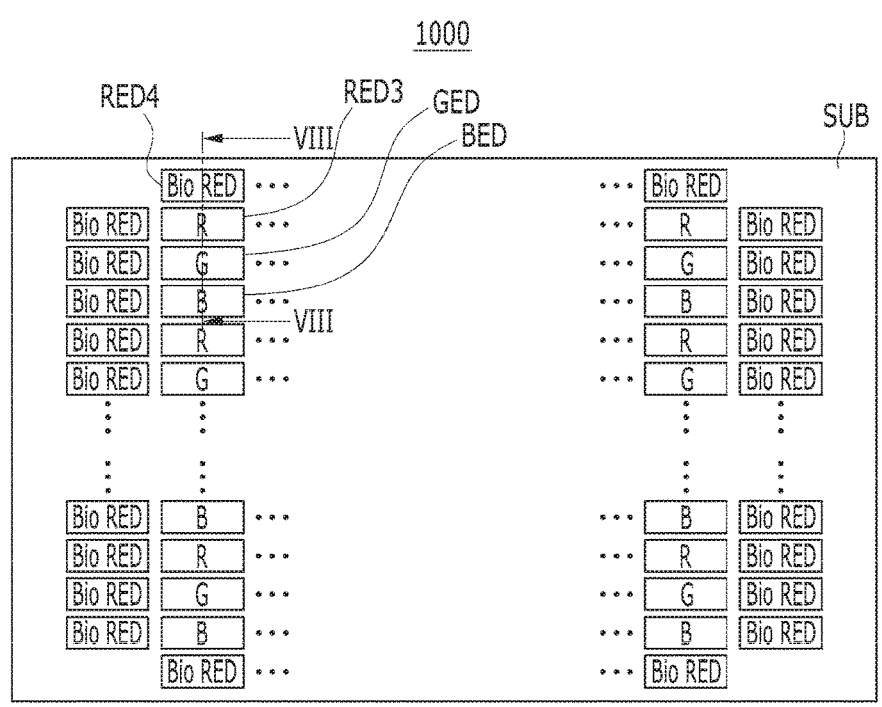
FIG. 7 is a top plan view showing an organic light emitting diode display according to another exemplary embodiment.

FIG. 7 is a top plan view showing an organic light emitting diode display according to an exemplary embodiment.

As shown in FIG. 7, the organic light emitting diode display 1000 according to an exemplary embodiment includes a substrate SUB, a third red organic light emitting element RED3, a fourth red organic light emitting element RED4, a green organic light emitting element GED, and a blue organic light emitting element BED. Here, the pixel that is a minimum unit displaying the image may include at least one among the third red organic light emitting element RED3, the fourth red organic light emitting element RED4, the green organic light emitting element GED, and the blue organic light emitting element BED.

The third red organic light emitting element RED3 emits the third red light having the third peak wavelength and the fourth red organic light emitting element RED4 emits the fourth red light having the fourth peak wavelength that is different from the third peak wavelength and is larger than the third peak wavelength. Here, the third peak wavelength of the third red light has the range of 580 nm to 620 nm, and the fourth peak wavelength of the fourth red light has the range of 620 nm to 680 nm, however they are not limited thereto.

The fourth red organic light emitting element RED4 is disposed adjacent to the border of the substrate SUB.

A plurality of fourth red organic light emitting elements RED4 is respectively disposed along the border of the substrate SUB.

The third red organic light emitting element RED3 may be adjacent to the fourth red organic light emitting element RED4. The third red organic light emitting element RED3 emits the third red light having the third peak wavelength. The third red organic light emitting element RED3 may be simultaneously emitted with the fourth red organic light emitting element RED4, however it is not limited thereto.

Figure 8:
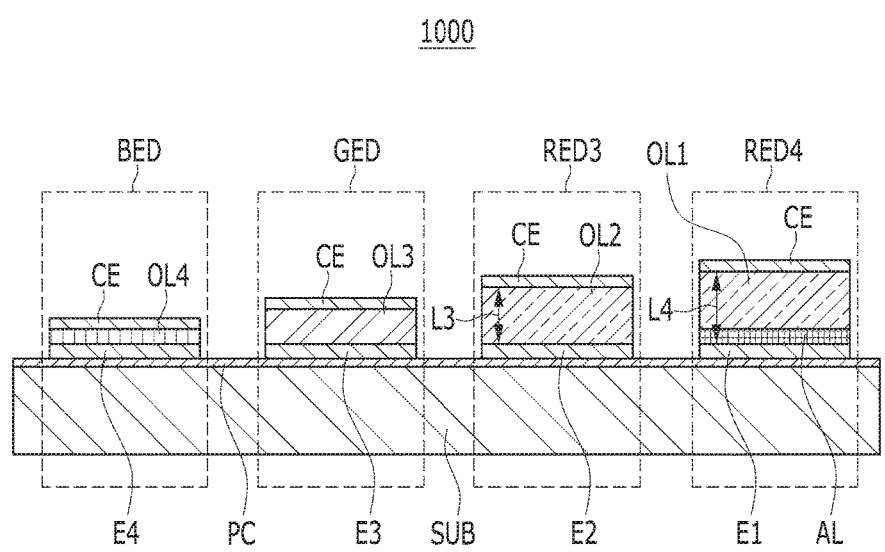
FIG. 8 is a cross-sectional view taken along a line VIII-VIII of FIG. 7.

FIG. 8 is a cross-sectional view taken along a line VIII-VIII of FIG. 7. In FIG. 8, each light emission region of the third red organic light emitting element RED3, the fourth red organic light emitting element RED4, the green organic light emitting element GED, and the blue organic light emitting element BED may be defined by the opening of the pixel definition layer that is not shown for convenience of description, however it is not limited thereto.

As shown in FIG. 8, the fourth red organic light emitting element RED4 includes a first electrode E1, a first organic emission layer OL1, a common electrode CE, and an auxiliary layer AL.

A fourth distance L4 is formed between the first electrode E1 and the common electrode CE. The fourth distance L4 may be the optimized distance at which the constructive interference is generated by corresponding to the fourth red light having the fourth peak wavelength of the range of 620 nm to 680 nm.

The third red organic light emitting element RED3 includes the second electrode E2, the second organic emission layer OL2, and the common electrode CE.

The third distance L3 is formed between the second electrode E2 and the common electrode CE. The third distance L3 may be the optimized distance at which the constructive interference is generated corresponding to the third red light having the third peak wavelength having the range of 580 nm to 620 nm.

As described above, in the organic light emitting diode display 1000 according to another exemplary embodiment, as the fourth red organic light emitting element RED4 emits the fourth red light having the fourth peak wavelength with the range of 620 nm to 680 nm, the user's melatonin secretion may be increased.

That is, the organic light emitting diode display 1000 improving the user's biorhythm by increasing the user's melatonin secretion is provided.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting diode display, comprising:
   a substrate;
   a first red organic light emitting element disposed on the substrate and including a first light emission region and a second light emission region adjacent to each other in a plan view; and
   a red color filter disposed on the first red organic light emitting element at a position corresponding to the second light emission region,
   wherein:
   the first light emission region is configured to emit externally a first red light having a first peak wavelength, and the second light emission region is configured to emit externally a second red light having a second peak wavelength different from the first peak wavelength;
   the first light emission region contacts the second light emission region in the plan view; and
   the red color filter is configured to block light having a wavelength of 620 nm to 640 nm.

2. The organic light emitting diode display of claim 1, wherein:
   the second peak wavelength is longer than the first peak wavelength.

3. The organic light emitting diode display of claim 2, wherein: the first peak wavelength is in a range of 580 nm to 619 nm; and the second peak wavelength is in a range of 641 nm to 680 nm.

4. The organic light emitting diode display of claim 2, wherein:
   the second peak wavelength is 650 nm.

5. The organic light emitting diode display of claim 1, wherein:
   the first red organic light emitting element comprises:
   a first electrode disposed on the substrate;
   a first organic emission layer disposed on the first electrode;
   a common electrode disposed on the first organic emission layer; and
   an auxiliary layer disposed between the first electrode and the first organic emission layer, wherein the auxiliary layer is positioned to correspond to the second light emission region.

6. The organic light emitting diode display of claim 5, wherein:
   the first electrode is a light reflective electrode;
   the common electrode is a transparent electrode; and
   the auxiliary layer is a light transmissive layer.

7. The organic light emitting diode display of claim 5, wherein: a distance between the first electrode and the common electrode in an area corresponding to the second light emission region is greater than a distance between the first electrode and the common electrode in an area corresponding to the first light emission region.

8. The organic light emitting diode display of claim 1, further comprising:
a second red organic light emitting element disposed adjacent to the first red organic light emitting element on the substrate and configured to emit the second red light.

9. The organic light emitting diode display of claim 8, wherein:
the first red organic light emitting element has a larger emission area than the second red organic light emitting element.

10. The organic light emitting diode display of claim 8, further comprising:
a green organic light emitting element disposed adjacent to the second red organic light emitting element on the substrate; and
a blue organic light emitting element disposed adjacent to the green organic light emitting element on the substrate.

11. The organic light emitting diode display of claim 8, wherein:
the first red organic light emitting element is disposed adjacent to a border of the substrate.

12. The organic light emitting diode display of claim 9, further comprising:
a plurality of the first red organic light emitting elements, wherein the plurality of first red organic light emitting elements are respectively disposed along the border of the substrate.

13. The organic light emitting diode display of claim 1, wherein:
the first light emission region and the second light emission region are configured to emit simultaneously.

14. An organic light emitting diode display, comprising:
a substrate; and
a first red organic light emitting element disposed on the substrate and including a first light emission region and a second light emission region adjacent to each other in a plan view,
wherein:
the first light emission region is configured to emit externally a first red light having a first peak wavelength, and the second light emission region is configured to emit externally a second red light having a second peak wavelength different from the first peak wavelength;
the first light emission region contacts the second light emission region in the plan view;
the first red organic light emitting element comprises:
a first electrode disposed on the substrate;
a first organic emission layer disposed on the first electrode;
a common electrode disposed on the first organic emission layer; and
an auxiliary layer disposed between the first electrode and the first organic emission layer;
the auxiliary layer is positioned to correspond to the second light emission region; and
the auxiliary layer does not overlap the first light emission region.

15. An organic light emitting diode display, comprising:
a substrate;
a third red organic light emitting element disposed on the substrate and configured to emit externally a third red light; and
a fourth red organic light emitting element disposed adjacent to the third red organic light emitting element on the substrate in a plan view and configured to emit externally a fourth red light,
wherein:
the third red light has a third peak wavelength, and the fourth red light has a fourth peak wavelength different from the third peak wavelength; and
the fourth red organic light-emitting element further comprises an auxiliary layer and the third red organic light-emitting element does not comprise the auxiliary layer.

16. The organic light emitting diode display of claim 15, wherein:
the fourth peak wavelength is longer than the third peak wavelength.

17. The organic light emitting diode display of claim 16, wherein:
the third red organic light emitting element and the fourth red organic light emitting element are configured to emit simultaneously.

\* \* \* \* \*